United States Patent
Guo et al.

(10) Patent No.: US 9,534,148 B1
(45) Date of Patent: Jan. 3, 2017

(54) METHOD OF POLISHING SEMICONDUCTOR SUBSTRATE

(71) Applicant: Rohm and Haas Electronic Materials CMP Holdings, Inc., Newark, DE (US)

(72) Inventors: Yi Guo, Newark, DE (US); David Mosley, Lafayette Hill, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 14/976,066

(22) Filed: Dec. 21, 2015

(51) Int. Cl.
*C09G 1/02* (2006.01)
*B24B 37/20* (2012.01)
*H01L 21/3105* (2006.01)

(52) U.S. Cl.
CPC ............... *C09G 1/02* (2013.01); *B24B 37/20* (2013.01); *H01L 21/31053* (2013.01)

(58) Field of Classification Search
CPC ....... C09G 1/02; B24B 37/20; H01L 21/31053
See application file for complete search history.

(56) References Cited

U.S. PATENT DOCUMENTS

| | | | |
|---|---|---|---|
| 7,108,579 B2 | 9/2006 | Wada et al. | |
| 8,017,524 B2 | 9/2011 | White et al. | |
| 8,252,687 B2 | 8/2012 | Li et al. | |
| 8,372,304 B2 | 2/2013 | Yamada et al. | |
| 8,414,789 B2 | 4/2013 | Shi et al. | |
| 2007/0269987 A1* | 11/2007 | Nakano | C09G 1/02 438/693 |
| 2010/0279507 A1* | 11/2010 | Guo | B24B 37/0056 438/693 |
| 2013/0140273 A1 | 6/2013 | Lu et al. | |
| 2014/0065825 A1 | 3/2014 | Shinoda et al. | |
| 2015/0376462 A1* | 12/2015 | Fu | C09G 1/02 438/693 |
| 2015/0380295 A1* | 12/2015 | Guo | C09G 1/02 438/693 |

* cited by examiner

*Primary Examiner* — Duy Deo
(74) *Attorney, Agent, or Firm* — Thomas S. Deibert

(57) ABSTRACT

A process for chemical mechanical polishing of a substrate is provided, comprising: providing the substrate, wherein the substrate has an exposed silicon dioxide; providing a chemical mechanical polishing composition, consisting of, as initial components: water, a colloidal silica abrasive; optionally, a substance according to formula (I); a substance according to formula (II); and, optionally, a pH adjusting agent; wherein a pH of the chemical mechanical polishing composition is ≤6; providing a chemical mechanical polishing pad with a polishing surface; dispensing the chemical mechanical polishing composition onto the polishing surface in proximity to an interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the exposed silicon dioxide is removed from the substrate.

10 Claims, No Drawings

METHOD OF POLISHING SEMICONDUCTOR SUBSTRATE

The present invention relates to the field of chemical mechanical polishing. In particular, the present invention is directed to a process for chemical mechanical polishing of a substrate having an exposed silicon dioxide is provided comprising: providing a chemical mechanical polishing composition, containing, as initial components: water, a colloidal silica abrasive, optionally a substance according to formula (I) and a substance according to formula (II); wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate; wherein at least some of the exposed silicon dioxide is removed from the substrate.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

A composition and method for polishing metal features is disclosed by Puppe et al. Specifically, in U.S. Patent Application Publication No. 20030157804, Puppe et al. disclose a composition containing 2.5 to 75% by volume of a 30% by weight cationically modified silica sol, the cationically modified SiO$_2$ particles of which have a mean particle size of 12 to 300 nm, and 0.5 to 22% by weight of at least one oxidizing agent, with pH of 2.5 to 6.

Notwithstanding, there exists a continued need for improved methods of chemical mechanical polishing of substrates having an exposed silicon dioxide feature.

The present invention provides a method of polishing a substrate, comprising: providing the substrate, wherein the substrate has an exposed silicon dioxide; providing a chemical mechanical polishing composition, consisting of, as initial components: water, 0.01 to 40 wt % of a colloidal silica abrasive; 0 to 0.5 wt % of a substance according to formula (I):

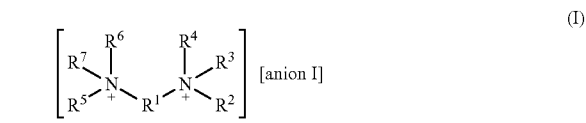

wherein $R^1$ is a $C_2$-$C_6$ alkyl group; wherein $R^2$, $R^3$, $R^4$, $R^5$, $R^6$ and $R^7$ are each independently selected from a saturated or unsaturated, optionally substituted, aryl, alkyl, aralkyl or alkaryl group having a carbon chain length of 1 to 15 carbon atoms; and, wherein anion I balances a charge on the substance according to formula (I) and is selected from the group consisting of a hydroxide, a halogen and an acetate; 0.001 to 0.5 wt % of substance according to formula (II):

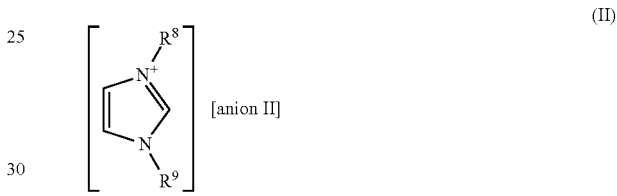

wherein $R^8$ and $R^9$ are each independently selected from hydrogen, a saturated or unsaturated, substituted or unsubstituted, alkyl, alkoxy, aryl, alkyl thioether group having 1 to 8 carbon atoms; and, wherein anion II balances a charge on the substance according to formula (II) and is selected from the group consisting of a hydroxide, a halogen and an acetate; and, optionally, a pH adjusting agent; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the exposed silicon dioxide is removed from the substrate.

The present invention provides a method of polishing a substrate, comprising: providing the substrate, wherein the substrate has an exposed silicon dioxide; providing a chemical mechanical polishing composition, consisting of, as initial components: water, 1 to 15 wt % of the colloidal silica abrasive, wherein the colloidal silica abrasive is a bimodal blend of a first population of colloidal silica and a second population of colloidal silica, wherein the first population of colloidal silica has an average particle size of 15 to 35 nm and the second population of colloidal silica has an average particle size of 40 to 60 nm; 0.02 to 0.03 wt % the substance according to formula (I), wherein $R^1$ is a $C_{4-6}$ alkyl group; wherein $R^2$, $R^3$, $R^4$, $R^5$, $R^6$ and $R^7$ are each independently selected from a $C_{1-6}$ alkyl group; and, anion I is a halogen; 0.01 to 0.04 wt % of the substance according to formula (II); a pH adjusting agent, wherein the pH adjusting agent is an inorganic acid; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the exposed silicon dioxide is removed from the substrate.

The present invention provides a method of polishing a substrate, comprising: providing the substrate, wherein the substrate has an exposed silicon dioxide; providing a chemical mechanical polishing composition, consisting of, as initial components: water, 1 to 15 wt % of the colloidal silica abrasive, wherein the colloidal silica abrasive is a bimodal blend of a first population of colloidal silica and a second population of colloidal silica, wherein the first population of colloidal silica has an average particle size of 15 to 35 nm and the second population of colloidal silica has an average particle size of 40 to 60 nm; 0.02 to 0.03 wt % the substance according to formula (I), wherein $R^1$ is a $C_{4-6}$ alkyl group; wherein $R^2$, $R^3$, $R^4$, $R^5$, $R^6$ and $R^7$ are each independently selected from a $C_{1-6}$ alkyl group; and, anion I is a halogen; 0.01 to 0.04 wt % of the substance according to formula (II), wherein $R^8$ and $R^9$ are each a $C_2$ alkyl group and wherein the anion II is selected from the group consisting of a halogen and an acetate; a pH adjusting agent, wherein the pH adjusting agent is an inorganic acid; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the exposed silicon dioxide is removed from the substrate.

DETAILED DESCRIPTION

The chemical mechanical polishing method of the present invention is useful for polishing substrates comprising an exposed silicon dioxide. The chemical mechanical polishing composition used in the method of the present invention contain a silicon dioxide rate enhancing amount of a substance according to formula (II). The chemical mechanical polishing composition used in the method of the present invention preferably contains a synergistic silicon dioxide rate enhancing combination of a substance according to formula (I) with the substance according to formula (II).

The term "enhanced silicon oxide removal rate" used herein and in the appended claims to describe the removal rate of silicon dioxide (for removal rate measured in A/min) resulting from the addition of (i) a substance according to formula (II) or (ii) a synergistic combination of a substance according to formula (I) and a substance according to formula (II); to the chemical mechanical polishing composition means that the following expression is satisfied:

$$A > A_0$$

wherein A is the silicon dioxide removal rate in A/min for a chemical mechanical polishing composition containing (i) a substance according to formula (II); or (ii) a synergistic combination of a substance according to formula (I) and a substance according to formula (II); used in the method of the present invention, as measured under the polishing conditions set forth in the Examples; $A_0$ is the silicon dioxide removal rate in A/min obtained under identical conditions except that the substances according to formula (I) and formula (II) are absent from the chemical mechanical polishing composition.

Preferably, the method of polishing a substrate of the present invention, comprises: providing the substrate, wherein the substrate has an exposed silicon dioxide feature; providing a chemical mechanical polishing composition, consisting of, as initial components: water; 0.01 to 40 wt % (more preferably 0.1 to 25 wt %, still more preferably 1 to 15 wt %, most preferably 3 to 7 wt %) of a colloidal silica abrasive; 0 to 0.5 wt % (preferably, 0.001 to 0.5 wt %; more preferably, 0.01 to 0.1 wt %; still more preferably, 0.015 to 0.04 wt %; most preferably, 0.02 to 0.03 wt %) of a substance according to formula (I):

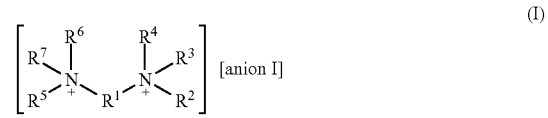

wherein $R^1$ is a $C_2$-$C_6$ alkyl group (preferably, a $C_{4-6}$ alkyl group; more preferably, a $C_4$ alkyl group); wherein $R^2$, $R^3$, $R^4$, $R^5$, $R^6$ and $R^7$ are each independently selected from a saturated or unsaturated, optionally substituted, aryl, alkyl, aralkyl or alkaryl group having a carbon chain length of 1 to 15 (preferably, 1 to 6; more preferably, 2 to 4) carbon atoms; and, wherein anion I balances a charge on the substance according to formula (I) (preferably, wherein the anion I is selected from the group consisting of hydroxide, halogen and acetate); 0.001 to 0.5 wt % (preferably, 0.005 to 0.1 wt %; more preferably, 0.01 to 0.05 wt %; most preferably, 0.01 to 0.04 wt %) of a substance according to formula (II):

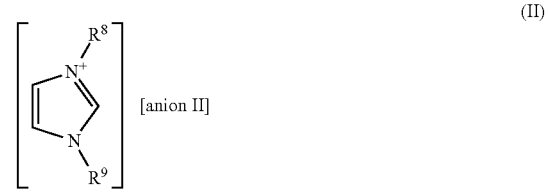

wherein $R^8$ and $R^9$ are each independently selected from hydrogen, a saturated or unsaturated, substituted or unsubstituted, alkyl, alkoxy, aryl, alkyl thioether group having 1 to 8 carbon atoms; and, wherein anion II balances a charge on the substance according to formula (II)(preferably, wherein anion II is selected from the group consisting of hydroxide, halogen and acetate); and, optionally, a pH adjusting agent; wherein a pH of the chemical mechanical polishing composition is ≤6; providing a chemical mechanical polishing pad with a polishing surface; dispensing the chemical mechanical polishing composition onto the polishing surface of the chemical mechanical polishing pad in proximity to an interface between the chemical mechanical polishing pad and the substrate; and, creating dynamic contact at the interface between the chemical mechanical polishing pad and the substrate with a down force of 0.69 to 34.5 kPa; wherein the substrate is polished; wherein some of the exposed silicon dioxide is removed from the substrate.

Preferably, in the method of polishing a substrate of the present invention, the substrate provided has an exposed silicon dioxide feature. More preferably, the substrate provided is a semiconductor substrate having an exposed silicon dioxide feature. Most preferably, the substrate provided is a semiconductor substrate having an exposed silicon dioxide feature derived from a tetraethalorthosilicate (TEOS).

Preferably, in the method of polishing a substrate of the present invention, the water contained in the chemical mechanical polishing composition provided is at least one of deionized and distilled to limit incidental impurities.

Preferably, in the method of polishing a substrate of the present invention, the colloidal silica abrasive contained in the chemical mechanical polishing composition provided has an average particle size ≤100 nm (preferably, 5 to 100 nm; more preferably, 10 to 60 nm; most preferably, 20 to 60 nm) as measured by dynamic light scattering techniques. Preferably, the colloidal silica contained in the chemical mechanical polishing composition is silicon dioxide based and is aluminum free. Preferably, the colloidal silica contained in the chemical mechanical polishing composition is not an aluminum silicate.

Preferably, in the method of polishing a substrate of the present invention, the chemical mechanical polishing composition provided contains 0.01 to 40 wt % (more preferably 0.1 to 25 wt %, still more preferably 1 to 15 wt %, most preferably 3 to 7 wt %) of a colloidal silica abrasive.

Preferably, the colloidal silica abrasive is a bimodal blend of a first population of colloidal silica and a second population of colloidal silica, wherein first population of colloidal silica has an average particle size of 15 to 35 nm (preferably, 20 to 30 nm; more preferably, 22.5 to 27.5 nm; most preferably, 24 nm to 26 nm) and the second population of colloidal silica has an average particle size of 40 to 60 nm (preferably 45 to 55; more preferably, 47.5 to 52.5; most preferably, 49 to 51 nm). Preferably, the bimodal blend is 75 to 90 wt % of the first population of colloidal silica and 10 to 25 wt % of the second population of colloidal silica abrasive.

Preferably, the chemical mechanical polishing composition used in the chemical mechanical polishing method of the present invention comprises 0 to 0.5 wt % (preferably, 0.001 to 0.5 wt %; more preferably, 0.01 to 0.1 wt %; still more preferably, 0.015 to 0.04 wt %; most preferably, 0.02 to 0.03 wt %) of a substance according to formula (I):

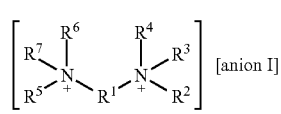

wherein $R^1$ is a $C_{2-6}$ alkyl group; wherein $R^2$, $R^3$, $R^4$, $R^5$, $R^6$ and $R^7$ are each independently selected from a saturated or unsaturated, optionally substituted, aryl, alkyl, aralkyl or alkaryl group having 1 to 15 (preferably, 1 to 6; more preferably, 2 to 4) carbon atoms; and, wherein anion I balances a charge on the substance according to formula (I)(preferably, wherein the anion I is selected from the group consisting of hydroxide, halogen and acetate). More preferably, the chemical mechanical polishing composition used in the chemical mechanical polishing method of the present invention comprises 0 to 0.5 wt % (preferably, 0.001 to 0.5 wt %; more preferably, 0.01 to 0.1 wt %; still more preferably, 0.015 to 0.04 wt %; most preferably, 0.02 to 0.03 wt %) of the substance according to formula (I), wherein $R^1$ is a $C_{4-6}$ alkyl group; wherein $R^2$, $R^3$, $R^4$, $R^5$, $R^6$ and $R^7$ are each independently selected from a $C_{1-6}$ alkyl group; and, wherein anion I balances a charge on the substance according to formula (I)(preferably, wherein the anion I is selected from the group consisting of hydroxide, halogen and acetate; more preferably, wherein the anion I is selected form hydroxide and halogen). Most preferably, the chemical mechanical polishing composition used in the chemical mechanical polishing method of the present invention comprises 0.001 to 0.5 wt % (more preferably, 0.01 to 0.1 wt %; still more preferably, 0.015 to 0.04 wt %; most preferably, 0.02 to 0.03 wt %) of the substance according to formula (I), $R^1$ is a —$(CH_2)_4$— group; wherein $R^2$, $R^3$, $R^4$, $R^5$, $R^6$ and $R^7$ are each a —$(CH_2)_3CH_3$ group; and, wherein the anion I is hydroxide.

Preferably, in the method of polishing a substrate of the present invention, the chemical mechanical polishing composition provided contains 0.001 to 0.5 wt % (preferably, 0.005 to 0.1 wt %; more preferably, 0.01 to 0.05 wt %; most preferably, 0.01 to 0.04 wt %) of substance according to formula (II):

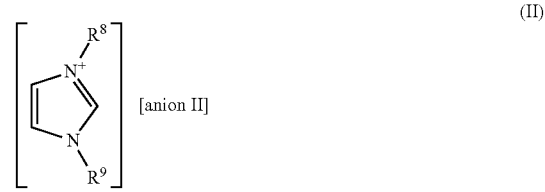

wherein $R^8$ and $R^9$ are each independently selected from hydrogen, a saturated or unsaturated, substituted or unsubstituted, alkyl, alkoxy, aryl, alkyl thioether group having 1 to 8 carbon atoms (preferably, a $C_{1-8}$ alkyl group; more preferably, a $C_{1-5}$ alkyl group; most preferably, a $C_2$ alkyl group); and, wherein the anion II balances a charge on the substance according to formula (II)(preferably, wherein the anion II is selected from the group consisting of hydroxide, halogen and acetate; more preferably, wherein the anion II is selected from the group consisting of halogen and acetate).

Preferably, in the method of polishing a substrate of the present invention, the chemical mechanical polishing composition is oxidizer free (i.e., contains O wt % oxidizer).

Preferably, in the method of polishing a substrate of the present invention, the chemical mechanical polishing composition is corrosion inhibitor free.

Preferably, in the method of polishing a substrate of the present invention, the chemical mechanical polishing composition provided has a pH of ≤6. More preferably, in the method of polishing a substrate of the present invention, the chemical mechanical polishing composition provided has a pH of 3 to 5. Still more preferably, in the method of polishing a substrate of the present invention, the chemical mechanical polishing composition provided has a pH adjusted to 3 to 5 by adding a titrant (preferably, an inorganic acid). Most preferably, in the method of polishing a substrate of the present invention, the chemical mechanical polishing composition provided has a pH adjusted to 3 to 5 by adding nitric acid, $HNO_3$.

Preferably, in the method of polishing a substrate of the present invention, the chemical mechanical polishing pad provided can by any suitable polishing pad known in the art. One of ordinary skill in the art will know to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to surface of the substrate being polished.

Preferably, in the method of polishing a substrate of the present invention, the chemical mechanical polishing composition provided has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 200 mm polishing machine; and, wherein the chemical mechanical polishing pad provided comprises a polyurethane polishing layer containing polymeric hollow core microparticles and a polyurethane impregnated non-woven subpad.

Preferably, in the method of polishing a substrate of the present invention, wherein the substrate has an exposed silicon dioxide feature; the chemical mechanical polishing composition provided has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

Some embodiments of the present invention will now be described in detail in the following Examples.

Comparative Examples C1-C5 and Examples 1-12

The chemical mechanical polishing compositions of Comparative Examples C1-05 and Examples 1-12 were prepared by combining the components in the amounts listed in TABLE 1 with the balance being deionized water and adjusting the pH of the compositions as needed to the final pH listed in TABLE 1 with nitric acid.

TABLE 1

| Ex # | Abrasive I[1] (wt %) | Abrasive II[2] (wt %) | Formula (I)[3] (wt %) | Formula (II) | | pH |
| | | | | BMIC[4] (wt %) | BC-04[5] (wt %) | |
|---|---|---|---|---|---|---|
| C1 | 6 | — | — | — | — | 3.56 |
| C2 | 6 | — | — | 0.00625 | — | 3.54 |
| C3 | 6 | — | — | 0.0125 | — | 3.53 |
| C4 | 5 | 1 | 0.075 | — | — | 3.0 |
| C5 | 5 | 1 | 0.075 | — | — | 3.0 |
| 1 | 6 | — | — | 0.025 | — | 3.59 |
| 2 | 6 | — | — | 0.050 | — | 3.55 |
| 3 | 6 | — | — | 0.075 | — | 3.54 |
| 4 | 5 | 1 | — | 0.075 | — | 3.5 |
| 5 | 5 | 1 | — | 0.06 | — | 3.5 |
| 6 | 5 | 1 | — | 0.06 | — | 3.0 |
| 7 | 5 | 1 | 0.025 | 0.025 | — | 3.5 |
| 8 | 5 | 1 | 0.025 | 0.05 | — | 3.5 |
| 9 | 5 | 1 | 0.025 | 0.035 | — | 3.5 |
| 10 | 5 | 1 | 0.025 | — | 0.015 | 3.5 |
| 11 | 5 | 1 | 0.025 | — | 0.025 | 3.5 |
| 12 | 5 | 1 | 0.025 | — | 0.035 | 3.5 |

[1] Abrasive I—Klebosol® II 1598-B25 slurry manufactured by AZ Electronic Materials, available from The Dow Chemical Company.
[2] Abrasive II—Klebosol® 30H50I slurry manufactured by AZ Electronic Materials, available from The Dow Chemical Company.
[3] N,N,N,N',N',N'-hexabutyl-1,4-butaneaminium dihydroxide from Sachem Co.
[4] 1-butyl-3-methylimidazolium chloride (BTMC) available from Sigma-Aldrich Co.

[5] 1,3-diethylimidazolium acetate (BC-04) available from BASF Corporation.

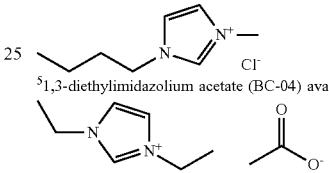

Comparative Examples PC1-PC5 and Examples P1-P12

Chemical Mechanical Polishing Removal Rate Experiments

Silicon dioxide removal rate polishing tests were performed in Comparative Examples PC1-PC5 and Examples P1-P12 using the chemical mechanical polishing compositions prepared according to Comparative Examples C1-05 and Examples 1-12, respectively. The silicon dioxide removal rate experiments were performed on eight inch blanket wafers having a silicon dioxide film on a silicon substrate using an Applied Materials 200 mm Mirra® polisher. All of the polishing experiments were performed using an IC1000™ polyurethane polishing pad (commercially available from Rohm and Haas Electronic Materials CMP Inc.) with a down force of 20.7 kPa, a chemical mechanical polishing composition flow rate of 200 ml/min, a table rotation speed of 93 rpm and a carrier rotation speed of 87 rpm. The silicon dioxide removal rates were determined by measuring the film thickness before and after polishing using a Jordan Valley JVX-5200T metrology tool. The results of the silicon dioxide removal rate experiments are provided in TABLE 2.

TABLE 2

| Ex # | Slurry Composition | SiO$_2$ (Å/min) |
|---|---|---|
| PC1 | Comparative Ex. C1 | 173 |
| PC2 | Comparative Ex. C2 | 308 |
| PC3 | Comparative Ex. C3 | 397 |
| PC4 | Comparative Ex. C4 | 2146 |
| PC5 | Comparative Ex. C5 | 2372 |

TABLE 2-continued

| Ex # | Slurry Composition | SiO₂ (Å/min) |
|---|---|---|
| P1 | Example 1 | 1077 |
| P2 | Example 2 | 2283 |
| P3 | Example 3 | 2381 |
| P4 | Example 4 | 1903 |
| P5 | Example 5 | 1768 |
| P6 | Example 6 | 1572 |
| P7 | Example 7 | 2225 |
| P8 | Example 8 | 2163 |
| P9 | Example 9 | 2442 |
| P10 | Example 10 | 2464 |
| P11 | Example 11 | 2455 |
| P12 | Example 12 | 2421 |

We claim:

1. A method of polishing a substrate, comprising:
providing the substrate, wherein the substrate has an exposed silicon dioxide;
providing a chemical mechanical polishing composition, consisting of, as initial components:
water,
0.01 to 40 wt % of a colloidal silica abrasive;
0 to 0.5 wt % of a substance according to formula (I):

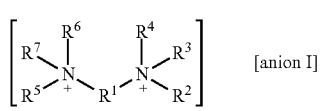 [anion I]   (I)

wherein $R^1$ is a $C_2$-$C_6$ alkyl group;
wherein $R^2$, $R^3$, $R^4$, $R^5$, $R^6$ and $R^7$ are each independently selected from a saturated or unsaturated, optionally substituted, aryl, alkyl, aralkyl or alkaryl group having a carbon chain length of 1 to 15 carbon atoms; and,
wherein anion I balances a charge on the substance according to formula (I) and is selected from the group consisting of a hydroxide, a halogen and an acetate;
0.001 to 0.5 wt % of substance according to formula (II):

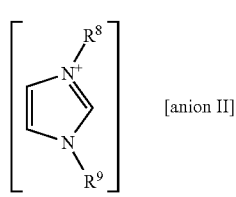 [anion II]   (II)

wherein $R^8$ and $R^9$ are each independently selected from hydrogen, a saturated or unsaturated, substituted or unsubstituted, alkyl, alkoxy, aryl, alkyl thioether group having 1 to 8 carbon atoms; and,
wherein anion II balances a charge on the substance according to formula (II) and is selected from the group consisting of a hydroxide, a halogen and an acetate; and,
optionally, a pH adjusting agent;
wherein a pH of the chemical mechanical polishing composition is ≤6;
providing a chemical mechanical polishing pad with a polishing surface;
dispensing the chemical mechanical polishing composition onto the polishing surface of the chemical mechanical polishing pad in proximity to an interface between the chemical mechanical polishing pad and the substrate; and,
creating dynamic contact at the interface between the chemical mechanical polishing pad and the substrate with a down force of 0.69 to 34.5 kPa;
wherein the substrate is polished; wherein some of the exposed silicon dioxide is removed from the substrate.

2. The method of claim 1, wherein the exposed silicon dioxide is derived from a tetraethylorthosilicate.

3. The method of claim 2, wherein the chemical mechanical polishing composition is corrosion inhibitor free.

4. The method of claim 2; wherein the chemical mechanical polishing composition has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

5. The method of claim 3; wherein the chemical mechanical polishing composition has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

6. The method of claim 1, wherein the chemical mechanical polishing composition provided, consists of, as initial components:
the water,
1 to 15 wt % of the colloidal silica abrasive, wherein the colloidal silica abrasive is a bimodal blend of a first population of colloidal silica and a second population of colloidal silica, wherein the first population of colloidal silica has an average particle size of 15 to 35 nm and the second population of colloidal silica has an average particle size of 40 to 60 nm;
0.02 to 0.03 wt % the substance according to formula (I), wherein $R^1$ is a $C_{4-6}$ alkyl group; wherein $R^2$, $R^3$, $R^4$, $R^5$, $R^6$ and $R^7$ are each independently selected from a $C_{1-6}$ alkyl group; and, anion I is a halogen;
0.01 to 0.04 wt % of the substance according to formula (II); and,
the pH adjusting agent, wherein the pH adjusting agent is an inorganic acid.

7. The method of claim 6, wherein $R^8$ and $R^9$ are each a $C_2$ alkyl group; wherein the anion II is selected from the group consisting of a halogen and an acetate; and, wherein the exposed silicon dioxide is derived from a tetraethylorthosilicate.

8. The method of claim 7; wherein the chemical mechanical polishing composition has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

9. The method of claim 6, wherein the bimodal blend is 75 to 90 wt % of the first population of colloidal silica and 10 to 25 wt % of the second population of colloidal silica; and, wherein the inorganic acid is nitric acid.

10. The method of claim 9, wherein the exposed silicon dioxide is derived from a tetraethylorthosilicate; and, wherein the chemical mechanical polishing composition has a silicon dioxide removal rate of ≥1,000 Å/min with a platen speed of 93 revolutions per minute, a carrier speed of 87 revolutions per minute, a chemical mechanical polishing composition flow rate of 200 mL/min, a nominal down force of 20.68 kPa on a 300 mm polishing machine; and, wherein the chemical mechanical polishing pad provided comprises a polyurethane polishing layer containing polymeric hollow core microparticles and a polyurethane impregnated non-woven subpad.

\* \* \* \* \*